US011384000B2

(12) United States Patent
Micak et al.

(10) Patent No.: US 11,384,000 B2
(45) Date of Patent: Jul. 12, 2022

(54) CONTROL SYSTEM AND AN ADAPTIVE ELECTROKINETIC DEWATERING SYSTEM INCORPORATING SAME FOR DEWATERING TAILINGS

(71) Applicant: Electro-Kinetic Solutions Inc., Toronto (CA)

(72) Inventors: James Micak, Ontaio (CA); Ed Hanna, Pickering (CA); Clare Armstrong, Hamilton (CA); Barna Szabados, Ancaster (CA); Steven Spencer, Hamilton (CA); Doug Kimzey, Knoxville, TN (US)

(73) Assignee: Electro-Kinetic Solutions, Inc., Toronto (CA)

( * ) Notice: Subject to any disclaimer, the term of this patent is extended or adjusted under 35 U.S.C. 154(b) by 680 days.

(21) Appl. No.: 16/270,076

(22) Filed: Feb. 7, 2019

(65) Prior Publication Data
US 2019/0241453 A1    Aug. 8, 2019

(51) Int. Cl.
*C02F 11/15*   (2019.01)
*C02F 11/00*   (2006.01)
*C02F 9/00*    (2006.01)
*G06F 30/20*   (2020.01)

(52) U.S. Cl.
CPC .............. *C02F 11/15* (2019.01); *C02F 9/00* (2013.01); *C02F 11/006* (2013.01); *G06F 30/20* (2020.01); *C02F 2201/4614* (2013.01); *C02F 2201/46135* (2013.01)

(58) Field of Classification Search
CPC .. C02F 11/15; C02F 9/00; C02F 11/00; C02F 1/15; G06F 17/50
See application file for complete search history.

(56) References Cited

U.S. PATENT DOCUMENTS 9,428,408 B2 *  8/2016  Beattie ................. C02F 1/463

* cited by examiner

Primary Examiner — Walter D. Griffin
Assistant Examiner — Cameron J Allen
(74) Attorney, Agent, or Firm — Boyle Fredrickson, S.C.

(57) ABSTRACT

An adaptive electrokinetic dewatering system for dewatering slurry and soil deposits, including tailings deposits and a control system therefor. The control system automatically determines an optimal applied power specification, including sets of power parameters to be applied to the deposit being dewatered and when to apply each set of power parameters during the electrokinetic dewatering process. Furthermore, the control system automatically adjusts the applied power specification throughout the course of the dewatering process to account for the changing properties of the deposit. The control system determines the applied power specifications and adjustments to be made to them by simulating the electrokinetic dewatering process using a simulator which incorporates the latest measurements of the electrical, physical and chemical properties of the deposit being dewatered. The control system uses the simulator to forecast the dewatering performances of alternative applied power specifications and selects and applies the alternative applied power specification having a forecast dewatering performance that satisfies one or more switching criteria set by an operator.

38 Claims, 6 Drawing Sheets

CONTROL SYSTEM AND AN ADAPTIVE ELECTROKINETIC DEWATERING SYSTEM INCORPORATING SAME FOR DEWATERING TAILINGS

FIELD OF THE INVENTION

This invention relates to the field of process control systems for pollution control, environmental remediation and reclamation of tailings produced by mining. More particularly, the present invention relates to the field of automatic process control systems and methods for using an automated control system to dewater slurries and soft soils.

BACKGROUND OF THE INVENTION

Many forms of mining produce tailings (i.e. the fine-grained waste remaining after an economic product has been extracted). These tailings are often produced in large quantities and are stored in tailings ponds. The tailings tend to segregate, with the coarser particles settling out relatively rapidly leaving a slurry of fine-grained particles in suspension. These slurries can take decades or longer to settle and for the resulting solids to dewater sufficiently to produce a geotechnical stable foundation. The result is large quantities of contaminated slurry accumulating over time that pose significant economic and environmental risks.

The environmental risks associated with these deposits include: 1) risk to fish and wildlife coming in contact with polluted water, 2) accidental breach of tailings pond dams and the release of fluid tailings into the surrounding watershed, 3) contamination of groundwater from polluted seepage out of the tailings ponds, and 4) long-term release of air pollutants including greenhouse gases.

The direct economic risks are associated with: 1) the immediate and future costs associated with dewatering and reclaiming tailings, 2) the potential costs associated with accidental releases, 3) increased operating costs associated with maintenance and supervision of large tailings deposits, 4) increased costs due to extended space requirements to store large tailings deposits and 5) "freezing" of future exploitable deposits by the presence of large overlying tailings deposits.

The Canadian oil sands industry is one of the largest, if not the largest, producer of tailings globally. The most common process used to extract bitumen from surface mined oil sands is the Clark hot water separation process. This process uses hot water to separate out the hydrocarbons from the sand and clay matrix. However, the separation process is not perfect and a liquid waste stream is produced containing residual bitumen, coarse sand and fines. Much of the sand in this mixture quickly settles. The remainder of this waste stream forms a stable colloidal mixture of water, clay (primarily kaolinite with some illite and montmorillonite), residual bitumen and other materials. One form of this colloidal mixture is called Mature Fine Tailings (MFT).

MFT is stored in large reservoirs called tailings ponds. When these ponds are filled with MFT, the water must be removed to create a geotechnically stable base adequate to allow land reclamation operations to take place. However, MFT is a persistent suspension that is not easy to dewater preventing reclamation from proceeding.

In some cases, the tailings may be treated with coagulants (e.g. gypsum) and/or flocculants (e.g. polyacrylimides); these additives may also be present in MFT or partially dewatered MFT. Some tailings may be mixed with froth tailings. Froth tailings are produced during the bitumen extraction process and included toxic residual solvents and naphthenic compounds. In some cases, MFT undergoes anaerobic biodegradation (e.g. methanogenesis) which results in the formation of strong GHG compounds (e.g. methane and volatile organic compounds). These additives to the tailings individually and in combination increase the long-term environmental risks.

Without active intervention, 200 years or more may be required for MFT to consolidate sufficiently to allow for reclamation. As a result, large quantities of contaminated MFT have accumulate over time across the surface of the landscape and given forecast of future oil sands mining activity, the area could increase many folds greater than the current situation.

The problems associated with dewatering and reclaiming oil sands tailings have been widely documented and are a primary focus of environmental opponents to the industry. The Alberta government has instituted a regulatory framework (i.e. the Tailings Management Framework) designed to prevent the continued long-term accumulation of oil sands tailings and to require the immediate dewatering and reclamation of the large inventory of "legacy" tailings that has accumulated over the last 50 years.

The oil sands industry has invested many billions of dollars searching for an effective means to dewater oil sands tailings. Despite repeated claims that an effective and reliable solution has been found, these claims have not proven to be reliable and the problem continues to grow. For this reason, large investments researching new technologies are continuing to be made.

The use of electrokinetics to accelerate the dewatering of such tailings has been proposed, but so far has not been implemented on a commercial scale. Improvements in both the economics and the functionality are required. Supervisory Control And Data Acquisition (SCADA) systems are well know in other process control contexts but have not been applied to regulate large-scale electrokinetic dewatering systems. SCADA systems provide an opportunity to improve the economics and the functionality of electrokinetic dewatering of oil sands tailings.

SUMMARY OF THE INVENTION

What is desired are systems and methods which overcome some of the problems associated with the prior art. In this specification, the term deposit means one or more of tailings, mature fine tailings (MFT), fluid fine tailings (FFT), sewage sludge, drilling mud, dredging spoils and soft clayey soils, which may be considered difficult to dewater absent the teachings of this invention. In this regard, it may be desirable to provide an automated control system for use in the electrokinetic dewatering of tailings deposits and other slurries and soils, which:

a) may be less expensive to manufacture and may reduce the overall cost to implement a tailings dewatering system or method;

b) may decrease the costs associated with operating a tailings dewatering process (i.e. may reduce electric power demand or may reduce labour costs);

c) may increase the speed or rate of a tailings dewatering process;

d) may optimize the speed or rate of a tailings dewatering process relative to other parameters (i.e. cost of electricity or electric power demand/consumption);

e) may increase an operator's control over a tailings dewatering process;

f) may allow an operator in a remote location to control a tailings dewatering process; or
g) may increase automation of a tailings dewatering process.

According to an embodiment of the present invention, there is disclosed an adaptive electrokinetic dewatering system for dewatering slurry and soil deposits, including tailings deposits. Preferably, the control system may be configured to monitor the deposit's properties and apply an optimal applied power specification including its power parameters in response to such properties. A series of optimal applied power specifications may be used which together comprise an applied power schedule. The preferred control system may therefore automatically update the applied power schedule throughout the course of the dewatering process in response to the changing properties of the deposit.

The control system may determine the optimal applied power specification to be used in the dewatering process by simulating the electrokinetic dewatering process for the tailings deposit being dewatered. Preferably, the simulator is initialised by the control system using the latest measurements of the electrical, physical and chemical properties of the deposit being dewatered as measured by sensors distributed throughout the deposit that are informationally linked to the control system.

The control system preferably generates one or more alternative applied power specifications. The dewatering performance of each alternative applied power specification may be forecast with the simulator. The dewatering performance may be evaluated based on switching criteria set by the operator. These switching criteria may define the level of dewatering that each applied power specification is designed to achieve. The control system selects from among the alternative applied power specifications, the applied power specification that best satisfies the switching criteria. The applied power schedule is updated accordingly by the control system and it implements the updated applied power schedule.

Therefore, in accordance with one aspect of the present invention, there is disclosed a control system for use in an electrokinetic dewatering system for dewatering a deposit said control system comprising:
   inputs and outputs;
   a programmed central processor;
   wherein said inputs include at least:
   sensor data from at least one sensor positioned in said deposit and adapted to measure present properties of said deposit; and
   an optimal applied power schedule including a series of applied power specifications with switching criteria for each applied power specifications indicating when a new applied power specification should be applied; and
   wherein said programmed central processor is configured to:
   a) simulate an electrokinetic dewatering process applied to said deposit based on said sensor data; and
   b) generate at least one alternative applied power specification, that when used in said simulation, satisfies said one or more of the switching criteria; and
   c) select the said at least one alternative applied power specification that best satisfies said one or more switching criteria; and
   wherein said outputs include an applied power specification and commands for controlling said electrokinetic dewatering system in accordance with said applied power specification.

In another embodiment, there may be provided a control system for use in electrokinetic dewatering of tailings. The control system may have inputs and outputs and a central processor. The inputs may include one or more switching criteria. The control system further may include inputs from sensors that substantially continuously measure the electrical, physical and chemical properties of the deposit being dewatered. The control system may be initialised with an optimal applied power schedule provided by the operator at the start of the adaptive electrokinetic dewatering process. Switching criteria are included in the applied power schedule for each applied power specification in the preferred form of the invention.

When the measured dewatering behaviour of the tailings being dewatered falls outside the acceptable variation limits specified by the operator, the control system activates the applied power specification optimisation routine. In this way, the control system determines a new optimal applied power specification based on multiple simulations of alternative applied power specifications.

According to another aspect of the present invention, there is disclosed a method of adaptively dewatering a deposit using an electrokinetic dewatering process, said method comprising the steps of:
   a) determining one or more dewatering performance criteria;
   b) measuring present properties of said deposit being dewatered;
   c) evaluating the current applied power specification relative to these performance criteria and making a determination if the applied power specification is appropriate;
   d) generating at least one alternative applied power specification;
   e) simulating said electrokinetic dewatering process applied to said deposit based on said present properties of said deposit and said at least one alternative applied power specification and generating a forecast dewatering performance based on said simulation;
   f) determining whether said forecast dewatering performance of said at least one alternative applied power specification satisfies said one or more switching criteria;
   g) if so, selecting an optimal one of said at least one alternative applied power setting that has the best forecast dewatering performance for use in said electrokinetic dewatering process, otherwise repeating said steps b) to f); and
   h) providing an applied power specification based on said optimal alternative applied power specification and controlling said electrokinetic dewatering process in accordance with said applied power specification.

In a still further embodiment, there may be provided a system for adaptively dewatering tailings using electrokinetics. The system may comprise a control system. The control system may be operatively connected to a data acquisition unit. As well, the control system may be operatively connected to a central power supply system. As well, the control system may be operatively connected to local power distribution substations. The substations can be connected to a central power supply system. Each local substation can be connected to a plurality of electrodes. The plurality of electrodes can be placed into the tailings prior to the initiating the dewatering operation. A plurality of sensors may be placed in the tailings before or during the dewatering operation. The sensors may be connected to the data acquisition unit and continuously record certain physical, electrical and chemical properties of the tailings. The control system may be configured to calculate an applied power specification for different combinations of electrodes based on the measured local properties of the tailings. The control system preferably causes the power provided to the plurality of electrodes through the power distribution substation to vary based on the applied power specification for each combination of electrodes.

Therefore, according to yet another aspect of the present invention, there is disclosed an adaptive electrokinetic dewatering system for dewatering a deposit, said system comprising:

the control system as defined above;
a source of electrical power;
at least one power distribution substation operably connected to said source of electrical power;
at least one electrode array operably connected to said at least one said power distribution substation, said at least one electrode array being positioned in said deposit and adapted to apply electric power to said deposit; and
said at least one sensor being operably connected to said control system;
wherein said commands control said source of electrical power and said at least one power distribution substation to apply electrical power to said deposit via said at least one electrode array in accordance with said applied power specification.

In further embodiments, the control system may include a user interface that allows the operator to set and/or modify dewatering performance criteria. Where desirable, the operator can override the automated power control system and can regulate manually the applied power.

The systems and methods disclosed herein may be used for process control systems, pollution control and geotechnical engineering applications. The adaptive electrokinetic dewatering process may be used to dewater slurries and soils thus producing a geotechnically stable product suitable for land reclamation and supporting geotechnical loads or for other applications. In particular, the systems and method may be used to dewater oil sands tailings. Dewatering can result in an environmentally stable and impermeable tailings deposit that effectively entombs contaminants contained in the dewatered material and in any material below the dewatered layer. Controlled dewatering also significantly reduces material handling and transportation costs. Depending on the intended end use of the material, the dewatering process may be adjusted to meet the specifications required for desired end uses.

BRIEF DESCRIPTION OF THE DRAWINGS

Reference will now be made by way of example only to preferred embodiments of the invention by reference to the following drawings in which.

DETAILED DESCRIPTION OF THE PREFERRED EMBODIMENTS

The present invention is described in more detail with reference to exemplary embodiments thereof as shown in the appended drawings. While the present invention is described below including preferred embodiments, it should be understood that the present invention is not limited thereto. Those of ordinary skill in the art having access to the teachings herein will recognize additional implementations, modifications and embodiments which are within the scope of the present invention as disclosed and claimed herein.

At the outset, it is noted that the exemplary embodiments of the invention are described below in the context of dewatering oil sands tailings deposits. However, the present invention is not limited to dewatering of tailings generally or MFT specifically but comprehends electrokinetic dewatering of many slurries and soils, no matter how or where they are lying, collected and contained or deposited. Without limitation, other slurries and soils that are comprehended by the present invention may include dredging spoils, municipal and industrial wastewaters and sludges, soft clayey soils and marine sediments. These materials are materials that either do not dewater naturally or dewater extremely slowly without intervention.

The energy efficiency of electrokinetic dewatering is strongly influenced by the applied power specification. An applied power specification describes the nature of the applied power over a defined interval. An applied power specification includes various applied power parameters that may be any property of electrical power and that may have an effect on the electrokinetic dewatering process. By way of example, an applied power specification may include one or more of the following applied power parameters: 1) a stepped increase in the applied voltage at the start-up of each power pulse including the number of steps, the voltage increment for each step and their duration, 2) the peak voltage, 3) the duration of the peak voltage, 4) the duration of the "rest" period between pulses of power, 5) intermittent periods of reversed polarity for some or all electrodes, 6) the duration of each polarity reversal, 7) the duration of the "rest" periods between polarity reversals and resumption of normal polarity applied power pulses.

It has been discovered that the applied power specification that yields the greatest energy efficiency is not constant over the course of the dewatering process. Regularly adjusting the applied power specification over the course of the dewatering process can significantly reduce the energy consumption and the dewatering rate of the process. It has been discovered that by varying the applied power specification among the electrode arrays over the course of the dewatering process, dewatering efficiency may be improved significantly. Finally, it has been discovered that by varying the applied power specification among the electrode arrays, the geotechnical properties of the dewatered tailings may be improved by creating more uniform vertical and horizontal density profiles.

According to the present invention, an applied power schedule comprises a series of applied power specifications and the criteria for switching from one specification to the next. The optimal applied power schedule is the sequence of applied power specifications that is most likely to satisfy the dewatering performance criteria specified by the operator most reliably and efficiently. The optimal applied power schedule is derived during the engineering design process for of an electrokinetic dewatering system. This forecast optimal applied power schedule is prescribed at the outset of the actual dewatering process.

The adaptive electrokinetic dewatering system 10 is designed to respond to the changes that occur during the electrokinetic dewatering process. During the electrokinetic dewatering process, the water content of the tailings deposit 20 decreases and various other changes occur, including the following:
1. resistivity increases;
2. hydraulic conductivity decreases;
3. electro-osmotic permeability decreases;
4. zeta potential becomes less favourable around the anodes due a decreasing pH;
5. zeta potential becomes more favourable around the cathodes due an increasing pH;
6. effective stress builds reducing the hydraulic contribution to the pore pressure gradient; and
7. internal density gradients form.

If no steps are taken to address these changes, the electrokinetic dewatering process slows down and will eventually stop altogether. As well, the dewatered tailings likely will not have the desired final physical characteristics (e.g. internal density distribution). The adaptive electrokinetic dewatering system 10 adjusts, when necessary, the applied power specification when the forecast changes in electrical, physical and chemical parameters are outside the tolerance limits specified by the operator.

Preferably, the adaptive electrokinetic dewatering system 10 is fully instrumented and the following monitoring data may be collected:
1. applied power (i.e. voltage and current);
2. local electric field strength;
3. local pore pressure; and
4. mudline/soil surface elevation.

Preferably, these data are collected on a continuous basis. As well, operators may opt to conduct additional sampling over the course of the electrokinetic dewatering process. Together these data/measurements may allow the dewatering rate being achieved by the electrokinetic dewatering process to be tracked and to be evaluated relative to the prescribed dewatering performance established at the outset of the dewatering process. However, the dewatering process is somewhat uncertain due the inherent variability in tailings deposits and other environmental factors. Accordingly, the optimal applied power schedule may need to be adjusted and updated over the course of the dewatering process.

The criteria for switching from one applied power specification to the next applied power specification in the applied power schedule may include the observed electrical, physical and chemical state of a tailings deposit as measured by sensors in the tailings deposit or elsewhere. The switching criteria specify the state that must be achieved to switch from one applied power specification to the next. The switching criteria may include one or more of: 1) a desired total amount of power consumed over the course of the applied power specification, 2) a desired level of dewatering at the end of an applied power specification, 3) a desired dewatering rate, 4) a desired total elapsed time since the start of an applied power specification and 5) desirable geotechnical properties at the end of an applied power specification. Desirable geotechnical properties may include shear strength, geotechnical stability and other geotechnical properties affecting future uses of the land after the dewatering process is complete.

As noted, the optimal applied power schedule may need to be adjusted over the course of the dewatering process. Preferably the control system automatically makes these adjustments over the course of the dewatering process by adjusting the applied power specifications as needed.

Determining an optimal adjustment to an applied power specification is complex and time consuming for an operator. It involves analyzing a large volume of data, producing numerous calculations and making comparisons among many alternatives to determine a balance among many physical, chemical, economic and geotechnical dewatering performance factors. The present invention preferably makes the task of determining the optimal adjustments to applied power specifications simple, reliable and automated. The result is that an operator can run an efficient and reliable electrokinetic dewatering process that is continually responsive to the current in situ conditions of a tailings deposit with minimal effort.

According to an embodiment of the present invention, the optimal applied power specifications at different times over the course of the electrokinetic dewatering process may be determined by:
1) generating a range of alternative applied power specifications,
2) forecasting the dewatering performance resulting from each alternative applied power specification using an electrokinetic dewatering process simulator,
3) evaluating the forecast dewatering performance of each alternative applied power specification using the switching criteria, and
4) selecting the alternative applied power specification that is forecasted to yield the best dewatering performance from that point on in the electrokinetic dewatering process through to the end.

As indicated above, the optimal applied power schedule may need to be adjusted during the electrokinetic dewatering process. Accordingly, the preferred embodiment of the present invention may involve continually updating the applied power schedule throughout the electrokinetic dewatering process. In practice, the applied power schedule is updated if an alternative applied power specification is forecast to improve dewatering performance compared to the current applied power specification.

Preferably, repeated adjustments to the applied power schedule over the course of the dewatering process will be performed automatically by an automated control system. In this way, the automated control system may be used to optimize dynamically the applied power schedule over the entire course of the electrokinetic dewatering process.

Figure 1:
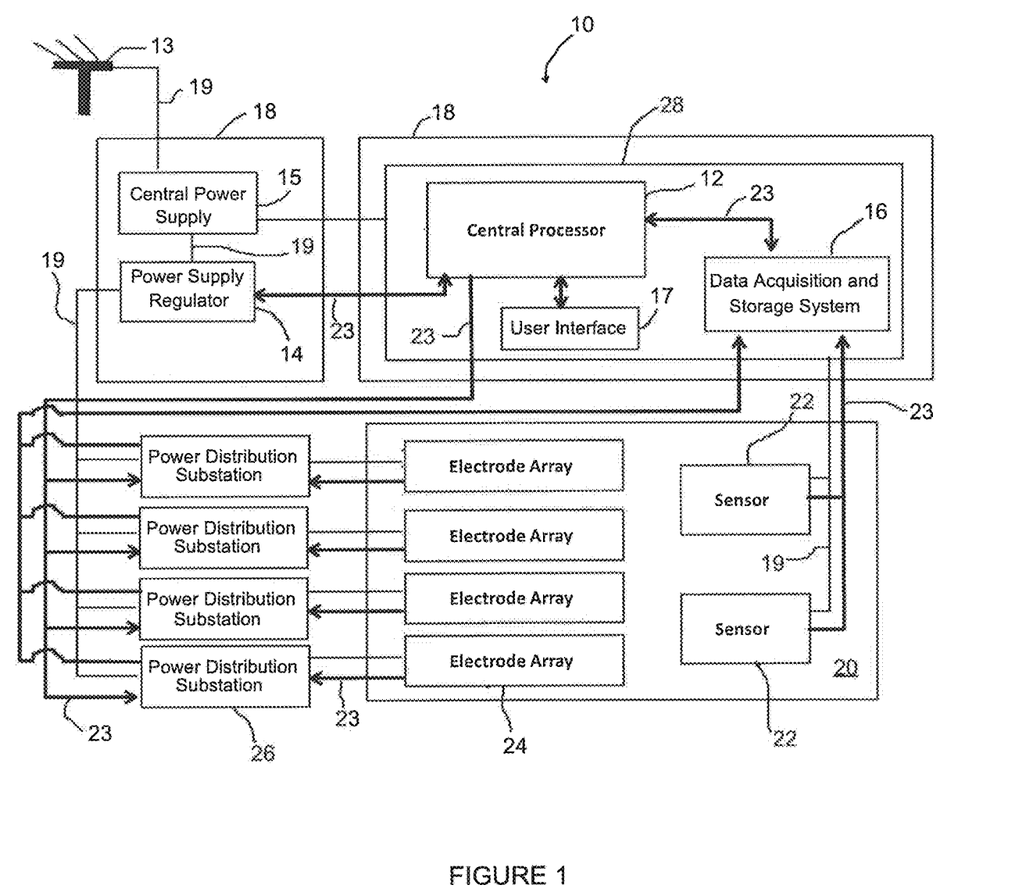
FIG. 1 shows a diagram of a control system for adaptively dewatering tailings, according to an embodiment of the present invention.

With reference to FIG. 1, there is shown generally an adaptive electrokinetic dewatering system 10 for dewatering a tailings deposit 20 according to an embodiment of the present invention. The adaptive electrokinetic dewatering system 10 includes: 1) a central processor 12, 2) a central power supply 15, 3) a power supply regulator 14, 4) a data acquisition and storage system 16 and 5) a user interface 17.

The central processor 12, the data acquisition and storage system 16 and the user interface 17 may form a control system 28 for the adaptive electrokinetic dewatering system 10.

The user interface 17 is configured to receive inputs from an operator and relay them to the central processor 12. Preferably, the user interface 17 may include an input device, such as for example a keypad or touch sensitive screen and an output device such as for example, a display, indicator lights or speaker. However, it is also contemplated that the user interface 17 may be a wired communications link, such as for example telephone, cable, fibre-optic internet or wireless communications link, such as for example a Bluetooth, cellular or radio receiver/transmitter to a remote access device. All such embodiments are comprehended by the present invention.

Via the user interface 17, the operator may modify one or more switching criteria to be used by the control system 28 when determining an optimal applied power specification.

Preferably, the control system 28 may be configured as a transportable module for use in the adaptive electrokinetic dewatering system 10. Most preferably, the transportable module may be configured as a self-contained unit 18 that is easy to transport from one tailings deposit 20 to the next. The self-contained unit 18 maybe any device or system that can be transported from one place to another, for example between tailings deposits or other dewatering sites. By way of example, the self-contained unit 18 may be a trailer, a pod or like device suitable for supporting and carrying the control system 28 over the expected terrain. Similarly, the central power supply 15 and the power supply regulator 14 may also be configured as a transportable module for use in the adaptive electrokinetic dewatering system 10 and that is a self-contained unit 18. It will be appreciated that the two transportable modules may be configured to be operably connectable to one another when the adaptive electrokinetic dewatering system 10 is set up in the field.

In FIG. 1, the central power supply 15 and the power supply regulator 15 are shown as separate self-contained units 18; however, the present invention comprehends the alternative for the control system 28, the central power supply 15 and the power supply regulator 14 being placed within the same self-contained unit 18.

The central power supply 15 is electrically connectable to a power grid 13 and capable of transforming voltage from the power grid (e.g. 30 MV) down to about 1 kV and to rectify the voltage from AC to DC. FIG. 1 shows the electrical connections 19 as thin lines between components of the adaptive electrokinetic dewatering system 10.

The central power supply 15 may also include a transformer electrically connectable to the control system 28 to supply electrical power to the control system 28. Accordingly, the central power supply 15 is preferably also capable of stepping down the AC voltage from the power grid 13 to an AC voltage level that is usable by the control system 28.

The central power supply 15 is electrically connected to the power supply regulator 14, which may be a separate component as shown in FIG. 1 or it may be incorporated into the central power supply 15.

The power supply regulator 14 is informationally connectable to the central processor 12 in the control system 28. In this way, the power supply regulator 14 may communicate with and be controlled by, the central processor 12.

Other components of the preferred adaptive electrokinetic dewatering system 10 may include sensors 22, a plurality of electrodes forming electrode arrays 24 and power distribution substations 26. The power distribution substations 26 may be placed around the perimeter of a tailings deposit 20. The sensors 22 and electrode arrays 24 may be placed within the tailings deposit 20. These other components may be installed as semi-permanent or permanent fixed assets. Furthermore, these components may be made to be reusable or disposable (i.e. not reusable).

The power supply regulator 14, under the control of the central processor 12, is configured to regulate the distribution of DC electrical power from the central power supply 15 to each of the power distribution substations 26. In particular, the power distribution substations 26 may transform the DC voltage they receive from the power supply regulator 14 down to the voltage specified by the applied power specification for its associated electrode arrays 24. The transformed voltage may be varied by the distribution substations 26 in response to commands from the central processor 12 in accordance with the corresponding applied power specification.

FIG. 1 shows four power distribution substations 26, however, it will be understood that more or fewer substations may be used, depending on the particular application. Each power distribution substation 26 is also electrically connected to one or more electrode arrays 24 that are located in the tailings deposit 20. Each electrode array 24 contains a plurality of electrodes (not shown). By way of example, an electrode array 24 may contain approximately 15 pairs of electrodes. FIG. 1 shows four electrode arrays 24, each being connected to one of the four power distribution substations 26.

Preferably, each power distribution substation 26 may also be informationally connectable to the central processor 12 in the control system 28. In FIG. 1, information connections 23 are shown with thick lines with arrows indicating directions of information flow including commands between components. In this way, the central processor 12 may control each power distribution substation 26 and may regulate the distribution of DC electrical power to each of the individual electrodes in an electrode array 24.

Preferably, each power distribution substations 26 is adapted to apply specific power parameters to each electrode in an electrode array 24 in accordance with commands received from the central processor 12. The power distribution substations 26 apply power parameters by modulating the electrical power to each electrode in the electrode arrays 24. Such modulations may include for example, changes in voltage, changes in the polarity of the voltage and the timing for each change. In this way, the power distribution substations 26, under the control of the central processor 12, are responsible for applying the applied power specification for each electrode array 24 to each of the electrodes in accordance with commands from the central processor 12.

Preferably, each power distribution substation 26 is also configured to monitor the performance of each electrode in its corresponding electrode array 24. Accordingly, in addition to being electrically connectable to a power distribution substation 26, the electrode array 24 is also informationally connectable to its corresponding power distribution substation 26. This configuration allows the performance of each of the individual electrodes to be measured by the power distribution substations 26 (i.e. the voltage and current being applied to the electrode arrays 24 by the power distribution substations 26). This information is then relayed to the data acquisition and storage system 16 where the data are stored for subsequent use by the central processor 12.

The data acquisition and storage system 16 may comprise one or more of the following components:

1) an analog to digital converter to convert signals into digital values, and 2) a memory-accessible storage device (e.g. a hard drive).

The data acquisition and storage system 16 is in communication with the central processor 12, such that the central processor 12 may receive the stored data from the data acquisition and storage system 16 at regular intervals or continuously, as required by a particular application.

Sensors 22 are adapted to be placed in the tailings deposit 20. They may be powered by an electrical connection 19 to the control system 28. They are also informationally connectable to the data acquisition and storage system 16. They are configured to measure the electrical, physical and chemical properties of the tailings deposit 20, such as: 1) the mudline elevation 80, 2) the local electric field strength and 3) the local pore pressure among other properties of the tailings deposit 20.

Electrokinetic dewatering of a tailings deposit 20 is achieved, according to an embodiment of the present invention, by applying an electric current to each of the electrodes in the electrode arrays 24 in a specific way, under the control of the central processor 12 in accordance with a series of applied power specifications that together comprise an applied power schedule.

Figure 2:
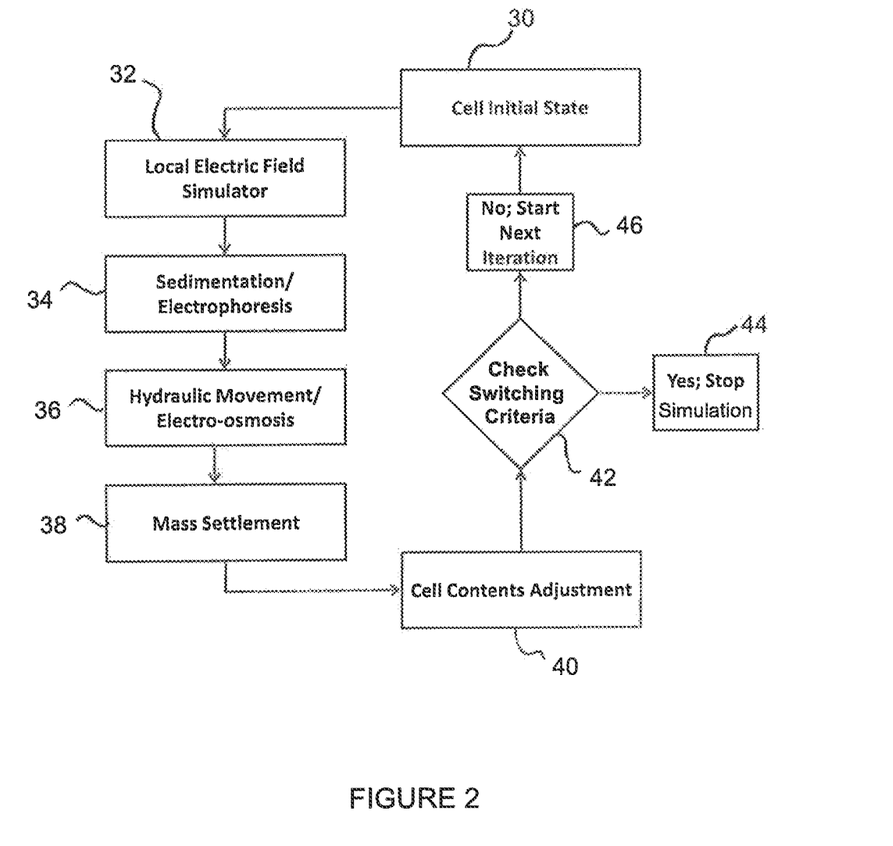
FIG. 2 is a flowchart showing the major steps performed by an electrokinetic dewatering process simulator which is part of the central processor 12 according to an aspect of the present invention.

FIG. 2 shows a flowchart illustrating the major steps performed by the electrokinetic dewatering process simulator. The electrokinetic dewatering process simulator is activated when the measured dewatering behaviour of a tailings deposit deviates outside specified limits. In general terms, the electrokinetic dewatering process simulator uses the latest electrical, physical and chemical data for the tailings deposit 20 to simulate the dewatering behaviour produced by an applied power specification.

Preferably the simulator uses a matrix of discrete interconnected cells that together represent the portion of a tailings deposit 20 being dewatered by an electrode array 24. The simulator forecasts the dewatering behaviour for each cell based on its initial state and the power parameters associated with a given alternative applied power specification. The number of cells used to represent the portion of a tailings deposit 20 being dewatered by an electrode array 24 may be varied by the operator. Increasing the number of cells increases the spatial resolution of the electrokinetic dewatering process simulator. Decreasing the number of cells decreases the spatial resolution of the electrokinetic dewatering process simulator.

The dimensions of individual cells may also be varied. However, the total number of cells defining the zone being dewatered will preferably be kept constant over the course of a simulation. Additionally, the cells may be any rectilinear shape, such as for example, squares, rectangles or other polygons.

The cells used by the simulator only need to have two dimensions. Dewatering forecasts based on two-dimensional cells may be reliably and accurately interpolated to a three-dimensional forecast where the electric field pattern along each electrode array 24 is constant. In the case of a large number of long parallel electrode arrays 24, the electric field along their length is uniform. In this way, reliable forecasts of the overall dewatering behaviour of the entire three-dimensional tailings deposit 20 can be produced.

The electrokinetic dewatering process simulator begins each simulation with the cell initial state 30 being set for each cell based on the latest measured properties of the tailings deposit 20.

The cell initial state is a representation of the electrical, physical and chemical state of each cell at the start of each timestep in a simulation. Since the properties of the tailings deposit 20 vary over the course of the dewatering process, the cell initial state 30 for each cell is updated at the start of each timestep based on the final state of the cell in the preceding timestep.

The simulator forecasts the impact of an applied power specification on the electrokinetic dewatering of a tailings deposit 20. By way of example, forecast dewatering results may include:

1) the dewatering rate, 2) the time required to reach a target density (i.e. a specific value for a corresponding switching criteria), 3) the energy consumption rate, 4) the total energy required to reach a target density, 5) the instantaneous power demand at different stages in the electrokinetic dewatering process, 6) density gradients over the course of the dewatering process, and 7) changes in the chemical properties of the tailings deposit being dewatered including the precipitation of dissolved cations (e.g. calcium, magnesium and potassium) in the pore water and electrocementation.

Generally, these dewatering forecasts apply to the portion of the tailings deposit being dewatered by an individual electrode array 24 and not to individual cells. In some cases, evaluating the dewatering performance of an alternative applied power specification requires aggregating the forecasts for each cell to derive the overall state of the tailings deposit at a specific point in the dewatering process. This aggregation is performed as part of the check switching criteria operation 42. The check switching criteria operation 42 is described in detail later.

Each dewatering forecast is compared to the switching criteria for the original applied power specification. If the dewatering forecast for the alternative applied power specification satisfies the switching criteria for the original applied power specification, the alternative applied power specification is selected to replace the original applied power specification. At this point, the electrokinetic dewatering process simulator moves on and repeats this sequence as needed for the next electrode array 24 whose dewatering behaviour has deviated significantly. This process repeats until the dewatering targets as defined by the switching criteria 42 for all electrode arrays 24 are forecast to be satisfied.

Electrokinetic dewatering is the result of two dominant reactions; namely electro-osmosis and electrophoresis. Both reactions are driven by the strength of the local electric field. Accordingly, forecasting the dewatering behaviour of an electrokinetic dewatering process requires forecasts of the local electric field throughout the process.

As well, experimental results have confirmed the underlying theory that with long parallel horizontal electrodes, the electric field does not vary significantly along the length of the electrodes or laterally across the electrodes except at the boundary of a set of electrode arrays. With large installations, this boundary area represents an insignificant proportion of the total tailings deposit being dewatered and is generally ignored during the operation phase of the process.

For these reasons, the electrokinetic dewatering process may be forecast using a two dimensional cross-section of the tailings deposit as opposed to a three dimensional representation of the entire deposit. The simulated two-dimensional results may be reliably and accurately interpolated over the entire tailings deposit 20 to simulate the overall dewatering behaviour of the electrokinetic dewatering process.

The local electric field simulator 32 forecasts the electric field strength for each cell for each timestep in a simulation. The local electric field may cause electrophoresis 34 (the movement of charged clay particles) and/or electro-osmosis 36 (the movement of hydrated cations and free pore water) depending on the solids content of the tailings. Pore water movement may also occur due to hydraulic pressure 36. These dynamics may cause the consolidation of the tailings deposit and the shrinking of its total solids volume. This shrinking is captured by the mass settlement function 38.

At the end of a timestep, the forecast final state of each cell may have changed. In particular, the volume of water and solids in the tailings in the uppermost cell may be less than the initial volume of the cell (i.e. the mudline has dropped). The cell contents adjustment routine 40 resolves this discrepancy in a series of steps.

1) The elevation of the top of the uppermost cell is adjusted to be at the same level as the new level of the mudline.

2) The total vertical distance between the electrodes is calculated.

3) The vertical dimension of each cell is adjusted proportionally so that the total combined height of the cells is equal to the vertical separation between the electrodes. These adjustments are made in proportion to the original height of each cell relative to the total vertical separation between the electrodes. In this way, the height of each cell remains constant relative to the heights of the other cells in the matrix.

4) The contents (i.e. solids and water content) of abutting cells are adjusted in proportion to the adjustment in the vertical heights of the cells. These adjusted cell dimensions and contents are the starting point for the next timestep in the simulation. More specifically, this new physical, electrical and chemical state of each cell becomes the cell initial state 30 for the next simulation timestep.

The local electric field simulator 32 forecasts the electric field strength for each cell for each timestep in a simulation. The operation of the local electric field simulator 32 is described in more detail with reference to FIG. 3. An applied power specification 50 is used to forecast a local electric field in the tailings deposit 20 as described later. The strength of the electric field varies throughout the tailings deposit 20 and is different in each cell in each timestep in each simulation. The local electric field strength is determined by the applied power specification, the position of the electrode arrays 52, the density gradients within the tailings 58 and the distance to each electrode 56 from the centre of each cell 54. The local density gradient 58 affects the local resistivity which in turn affects the local electric field strength.

Figure 3:
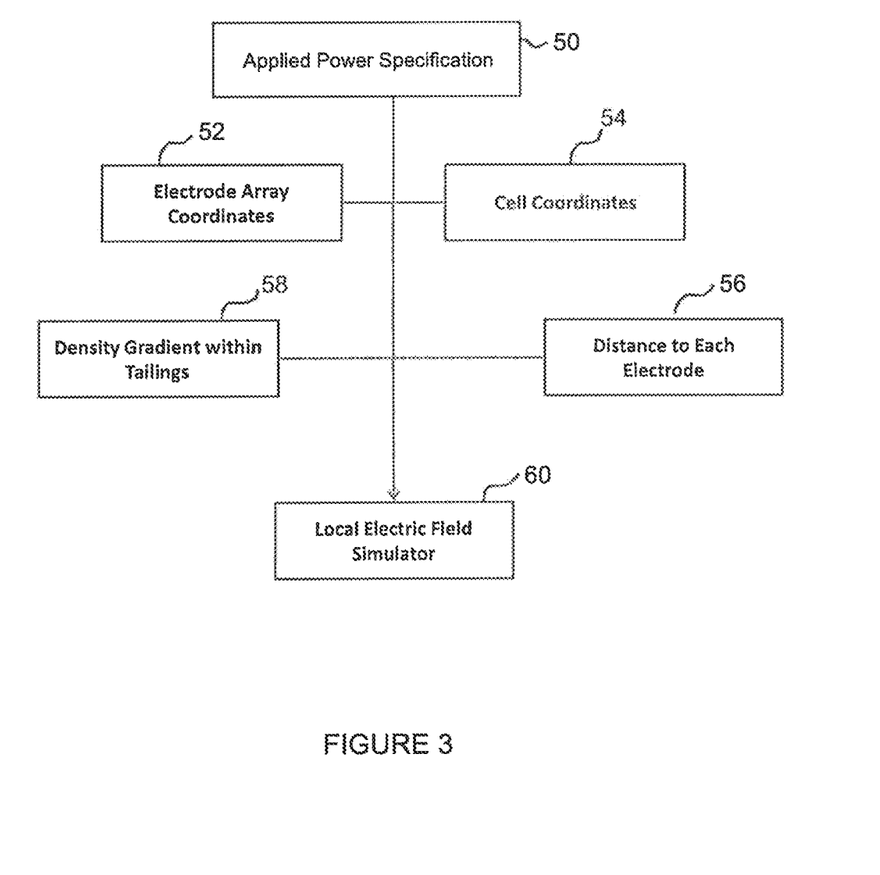
FIG. 3 is a flowchart showing the steps that an electric field forecasting routine performs at the start of each timestep (i.e. each discrete time interval) according to an aspect of the present invention.

The positions of the electrodes and the positions and dimensions of the cells are dynamic and change from one timestep to the next in a simulation (the causes for this variation are described later). Likewise, the density gradients change with each timestep. For this reason, the position of the electrode arrays 52, the distance to each electrode 56 from the centre of each cell 54 and the local density gradient 58 are updated at the start of each timestep.

Preferably, the control system 28 may repeat the following steps to produce a forecast of the electrokinetic dewatering process of the tailings deposit 20:

1) update the present properties of the tailings deposit 20;
2) generate an alternative applied power specification based on the present properties of the tailings deposit 20;
3) simulate the electrokinetic dewatering of the tailings deposit using the alternative applied power specification to forecast dewatering performance;
4) evaluate the forecast dewatering behaviour against one or more switching criteria; and
5) select and apply the applied power specification if the switching criteria are forecast to be satisfied; otherwise, steps 2) to 5) are repeated until an applied power specification is selected that satisfies the switching criteria.

Figure 4:
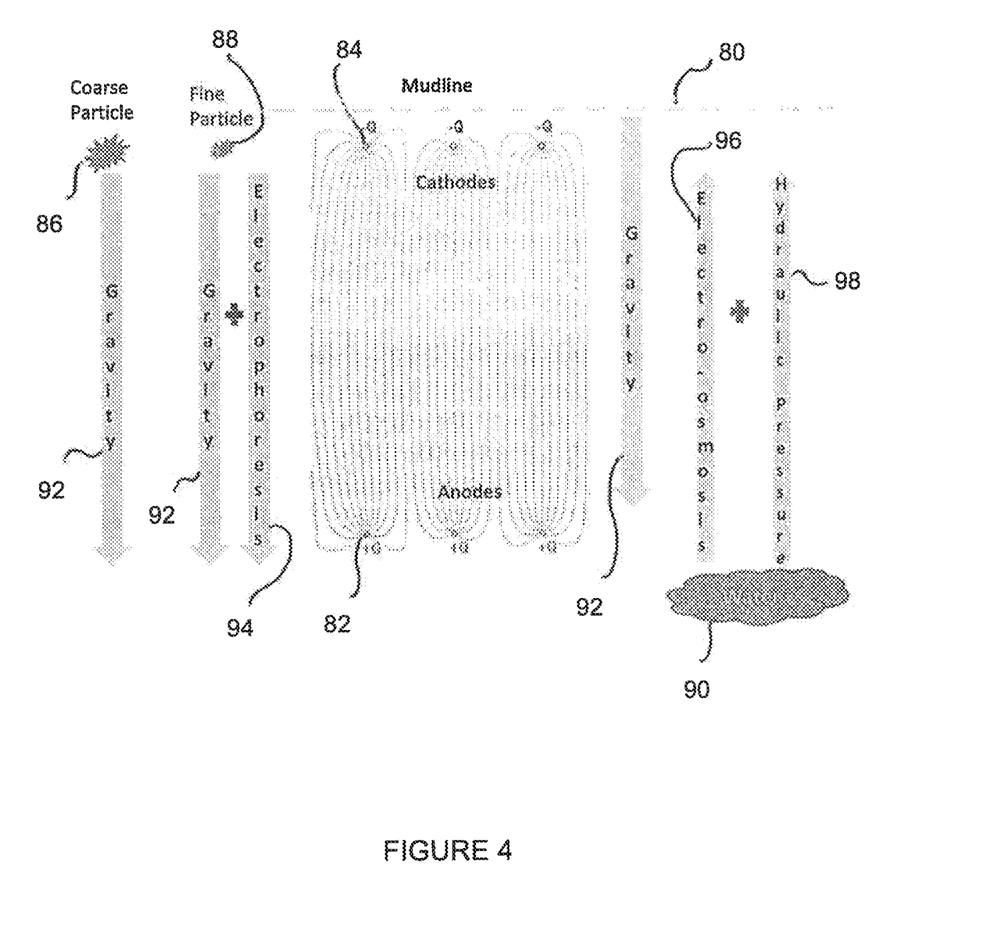
FIG. 4 is a schematic showing the movement of particles, water and solid mass during the course of the dewatering process according to an aspect of the present invention.

FIG. 4 shows the movements of coarse particles, fine particles and water in a tailings deposit 20 during the electrokinetic dewatering process according to an embodiment of the present invention. The surface of the tailings defines the mudline 80. The electrode arrays 24 are deployed in the tailings deposit 20 with anodes 82 in horizontal rows below cathodes 84 in horizontal rows immediately below the mudline 80. When the tailings deposit 20 is in a slurry form, particles 86 and 88 settle toward the bottom of the deposit. Coarse particles 86 settle due to the force of gravity 92. The settling velocity is governed by Stokes' law and the principles of free and hindered settling. Fine clay particles 88 are largely pulled downward by electrophoresis 94 with some assistance from gravity 92 once electrostatic bonds are broken and downward movement is initiated. Water 90 moves in the opposite direction to the particles 86 and 88. The upward movement of water 90 is driven by the upward hydraulic pressure gradient 98 created by the overlying solids plus the upward electro-osmotic pressure gradient 96. The mudline 80 drops as the total volume of the tailings deposit 20 is reduced due to water being released. This process leads to the consolidation of the tailings deposit 20 and increased geotechnical strength.

Figure 5:
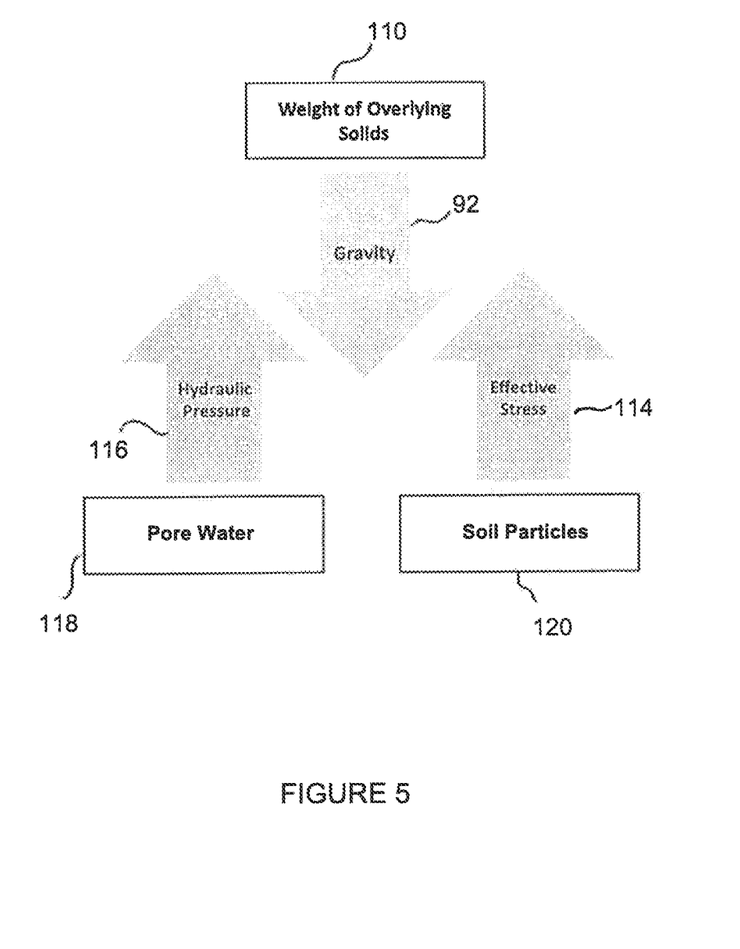
FIG. 5 is a graphical representation of the interaction of hydraulic pressure and effective stress during the dewatering of a tailings deposit according to an aspect of the present invention.

FIG. 5 shows the interaction of soil particles 120 and pore water 118 as the electrokinetic dewatering process progresses according to an embodiment of the present invention. When the tailings are in a slurry and are beginning to form a matrix of interacting soil particles 120, hydraulic pressure 116 is created by the weight of the overlying solids 110 that is supported by the pore water. Water is non-compressible and resists the force of gravity 92 pulling the solids downward. The result is that the pore pressure gradient that is formed pushes the pore water 118 upward. This upward movement is increased significantly by the upward electro-osmotic pressure gradient that is created by the electrokinetic dewatering process.

As the pore water 118 moves upward, the pores in the soil matrix compress. The soil particles 120 are forced closer together until they begin to interact with one another and begin to form a soil matrix. At this point, some of the weight of the overlying solids 110 is transferred to the soil particles 120 causing the hydraulic pressure 116 to be reduced proportionately and effective stress to begin to be formed. This process continues until all of the weight of the overlying solids 110 is supported by the soil particles 120 and the effective stress equals the total stress. At this point, the material is deemed from a geotechnical perspective to be fully consolidated.

When full consolidation is reached locally, the hydraulic pressure is zero and all further dewatering is caused only by electro-osmosis. Importantly, electro-osmotic dewatering continues well past this point and produces an overconsolidated soil. The amount of overconsolidation is largely determined by the strength of the local electric field.

Figure 6:
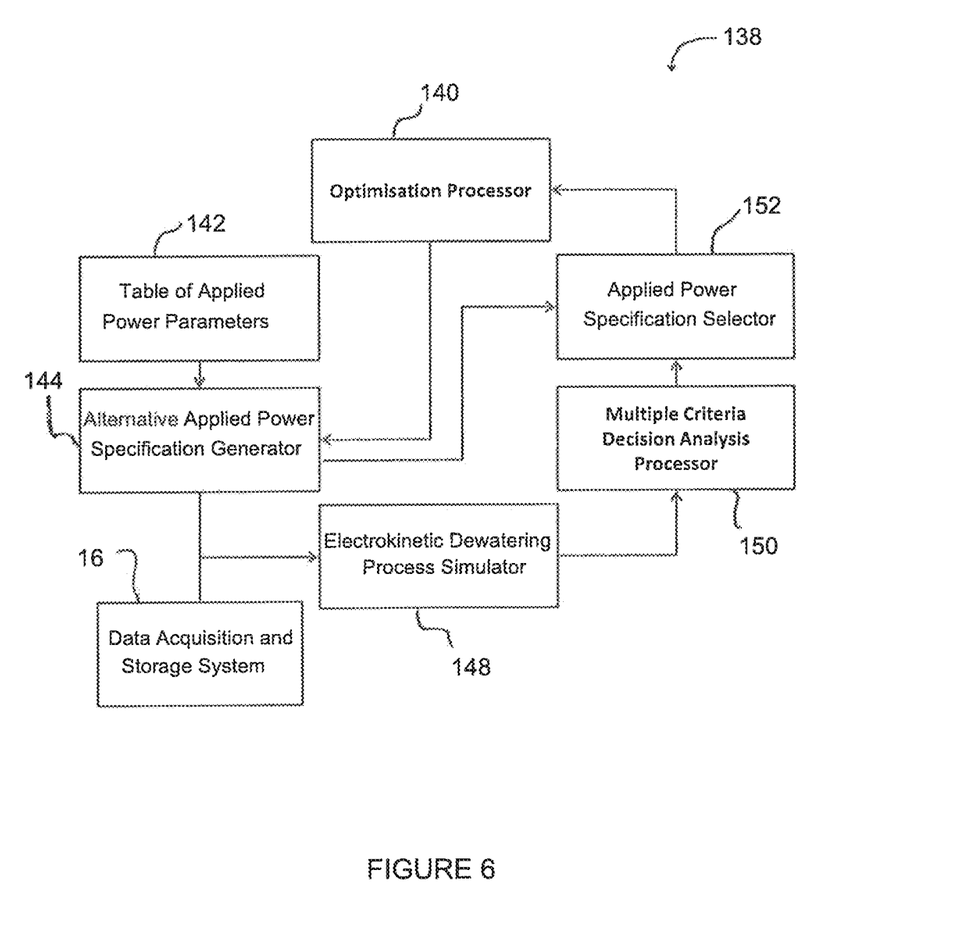
FIG. 6 is a flowchart showing the steps that an optimisation routine performs for each alternative applied power specification according to an aspect of the present invention.

FIG. 6 shows the interactions of the various components of an optimization routine that may be coordinated by the programmed central processor 12. Preferably, the central processor 12 includes an optimisation processor 140, which is configured to search for and select an applied power specification that best satisfies the switching criteria.

The optimisation processor 140 is initially configured with an optimal applied power schedule for each set of electrode arrays. This initial applied power schedule is produced during the engineering design of an electrokinetic dewatering installation. This schedule is the applied power schedule used at the start-up of the electrokinetic dewatering process.

The initial applied power schedule for a set of electrode arrays is followed as long as the observed dewatering behaviour of the tailings deposit 20 is within the tolerance limits defined by the operator. The central processor 12 monitors the data measured by the sensors 22. When the dewatering process for one or more electrode arrays is detected to fall outside of the specified tolerance limits, the central processor activates the optimisation routine 138 in FIG. 6 for these electrode arrays.

When the optimisation routine 138 is activated, preferably the first step is to update the electrokinetic dewatering process simulator 148 with the latest data measured by the sensors 22 in the tailings deposit 20. These data may be used as the basis for forecasting the electrical, physical and chemical properties of each cell over the course of the dewatering process. The electrical, physical and chemical properties of each cell define the starting parameters for all simulations run by the electrokinetic dewatering process simulator 148.

The next step involves the optimisation processor 140 sending instructions to the alternative applied power specifications generator 144 to generate a new alternative applied power specification to replace the current applied power specification. The starting point for the process of generating an alternative applied power specification is the power parameter values in the current applied power specification or where other alternative applied power specifications have been analysed, the power parameter values for the immediately previously analysed alternative applied power specification may be used as the starting point.

New values for some or all of these power parameters are systematically selected from a table of applied power parameters 142. This table specifies the acceptable ranges for each parameter given the electrical, physical and chemical state of a specific tailings deposit. The values may be selected using a random value generator with values ranging from 0 to 1. The limits of the acceptable ranges for each parameter are assigned values of 0 and 1 and the range is scaled from 0 to 1. The random value is translated into a corresponding value within the acceptable range for the parameter.

The new alternative applied power specification is analysed using the electrokinetic dewatering process simulator 148. The electrokinetic dewatering process simulator 148 forecasts the dewatering that is expected to occur in each cell for each discrete timesteps. The temporal resolution for the electrokinetic dewatering process forecast, that is the length of each timestep, may be defined at the outset of a simulation by the operator.

In general, the minimum temporal resolution is defined by the spatial resolution (i.e. the dimensions of the cells) and the electrical, physical and chemical characteristics of the tailings deposit 20 being dewatered. The temporal resolution typically is constrained by the velocity of the movement of particles and water. The temporal resolution should not be less than the time required for water and solids to move half way across the length of any cell included in the forecast.

The spatial resolution of the electrokinetic dewatering process simulator 148 is also variable and may be specified at the outset of a simulation by the operator. The spatial resolution is increased by increasing the number of cells.

The dimensions of individual cells may vary. Typically, smaller cells are specified around the anodes and to a lesser extent, around the cathodes. The electric field varies the most in these two regions and is most important for forecasting the dewatering performance of the dewatering process. Nonetheless, the total number of cells defining the zone being dewatered is constant over the course of a simulation.

As the electrokinetic dewatering process progresses, the mudline 80 in the tailings deposit drops due to settlement and consolidation. After each iteration, the cell dimensions are redefined proportional to the original configuration. In this way, the spatial resolution increases with each iteration as the electrokinetic dewatering process progresses.

Dewatering by an electrokinetic dewatering process is driven by the local electric field. The local electric field simulator 32 forecasts the electric field strength for each cell for each timestep in a simulation. The local electric field may cause electrophoresis 34 (the movement of charged clay particles) and electro-osmosis 36 (the movement of hydrated cations). Pore water movement may also occur due to hydraulic pressure 36. These dynamics may cause the consolidation of the tailings deposit and the shrinking of its total volume. This shrinking is captured by the mass settlement function 38. At the end of a discrete timestep, the contents of each cell 40 are forecast to have changed. This new electrical, physical and chemical state of the cell becomes the cell initial state 30 for the next simulation timestep.

The number of iterations (i.e. timesteps) for a simulation may be determined by the dewatering performance of the tailings deposit 20 and the required state at the end of the alternative applied power specification. A simulation run is terminated when the alternative applied power specification has achieved the switching criteria.

The electrokinetic dewatering process simulator 148 runs a simulation using the power parameters provided for the alternative applied power specification. The electrokinetic dewatering process simulator 148 simulates the dewatering behaviour of the tailings deposit 20 using the values for the power parameters that comprise the alternative applied power specification. The electrokinetic dewatering process simulator 148 generates a forecast of the dewatering performance for the alternative applied power specification. The forecast may include forecast values for each switching criterion. The electrokinetic dewatering process simulator 148 may provide an estimate of the amount of electricity required for electrokinetic dewatering the tailings and the time required to achieve the desired final dewatered state of the tailings deposit 20.

A variation of the basic electrokinetic dewatering process simulator 148 may involve the entire electrode array 24 sinking as the mudline 80 drops. In this case, the anodes 82 continue to sink and the vertical separation between the electrodes remains constant. The anodes 82 sink until the density of the underlying tailings is sufficient to support the weight of the anodes 82. At this point, the separation distance between the cathodes 84 and anodes 82 begins to decrease as the mudline drops. The cell dimensions from this point on need to be adjusted for the mudline drop after each iteration.

The forecast dewatering performance results for each alternative applied power specification are read into a multiple criteria decision analysis processor 150. The simulator produces forecasts of the physical dewatering performance for an alternative applied power specification. This processor calculates a dewatering performance score for the alternative applied power specification. By way of example, a dewatering performance score may be a number between 0 and 100 and is an aggregated weighted score. The operator specifies the relative importance of each switching criterion (i.e. assigns weights to each criterion). The aggregate score is calculated by multiplying the physical performance rates by the weights and adding the products for each switching criterion together.

The calculated dewatering performance score is forwarded to an applied power specification selector 152. The selector first evaluates the forecast dewatering performance of the alternative applied power specification relative to the forecast dewatering performance of the current applied power specification in terms of each of the switching criteria. If the alternative applied power specification is forecast to be able to "correct" adequately the forecast dewatering behaviour of the optimum applied power schedule, that is to bring the dewatering process back within the tolerance limits associated with the current applied power specification, the applied power specification selector 152 reports to the optimisation processor 140 that the optimisation routine should be stopped and the applied power schedule should be updated accordingly using the new alternative applied power specification.

If the dewatering behaviour of the new alternative applied power specification is forecast to correct the electrokinetic dewatering process such that the remainder of the applied power schedule is expected to be valid and the remainder of the dewatering process is expect to conform with the initial forecasts, the applied power schedule is updated with the new applied power specification and the optimisation cycle is terminated.

If the new alternative applied power specification is not able to correct adequately the forecast dewatering behaviour of the optimum applied power schedule, the applied power specification selector 152 reports to the optimisation processor 140 that the optimisation routine should be repeated by generating a new alternative applied power specification. This cycle is repeated until one of two conditions is satisfied:

1) An alternative applied power specification is found that is forecast to be able to correct adequately the observed dewatering behaviour of the current applied power specification, or 2) The number of alternative applied power specifications is equal to the maximum number of iterations specified by the operator.

If the second condition is the outcome, the applied power specification selector 152 selects the best alternative applied power specification from among those analysed. The applied power specification selector 152 instructs the optimisation processor 140 to repeat the optimisation cycle for the next applied power specification in the series of applied power specifications that comprise the applied power schedule. The same methodology is used for this next applied power specification. The initial cell conditions for all alternative applied power specifications for this series of optimisation tests are defined by the forecast end state for the preceding best alternative applied power specification.

This process is repeated in series for as many of the applied power specifications in the applied power schedule as is necessary until the electrokinetic dewatering process is adequately corrected and a new applied power schedule is produced.

If after all of the applied power specifications in the initial applied power schedule have been analysed and a combination of applied power specifications has not been found that is able to correct adequately the electrokinetic dewatering process, the initial applied power schedule is abandoned. A new applied power schedule is created by the applied power specification selector by combining each of the alternative applied power specifications that have been identified as being best for each stage in the dewatering process.

The electric field simulator 32 simulates the average electric field strength for each cell for each timestep. The generic equation for estimating the local electric field strength is shown by Equation #1.

Local Electric Field Strength $$E_{i,t} = \frac{\varepsilon_{r_{i,t}}}{4\pi} \sum_{t=1}^{n} \frac{q_t}{R_{i,t}^2} \qquad \text{Equation 1}$$

Where
$E_{i,t}$ is the electric field strength in cell i in time t [V/m]
$\varepsilon_{r_{i,t}}$ is the relative dielectric constant of the medium in cell i in time t [dimensionless]
$q_t$ is the unit charge of a small segment of electrode in time t [coulombs]
$R_{i,t}$ is the distance from the location on the electrode with a q unit charge to the centre of cell i in time t [m]

The local electric field is produced by many pairs of electrodes. The electric field equation accounts for the contribution of each electrode to the local electric field; albeit the contribution of each electrode decreases significantly as the separation distance increases. This electric field equation is fundamentally derived from Maxwell's equations.

When the tailings are in a slurry form (i.e. up to 50-55% solids), the fine clay particles are mobile. In the absence of an electric field, these particles form a colloidal suspension that remains indefinitely due to the electrostatic repulsion of the charged particles. In this state, little to no gravity-driven sedimentation occurs among the fine clay particles. When an electric field is applied, the negatively charged clay particles are drawn downward toward the anodes; assuming horizontally oriented electrodes with the anodes 82 below the cathodes 84 as shown in FIG. 4.

This additional downward force causes the electrostatic forces holding the clay particles in suspension to be overcome and the particles begin to move downward as shown in FIG. 4. At this point, the downward electrophoretic force 94 is supplemented by the downward force of gravity 92.

Gravity Particle Settlement $$u_{f,g_{i,t}} = g \times (\rho_s - \rho_w) \times \frac{d_f^2}{(18 \times \mu \times 1000)} \qquad \text{Equation 2}$$

Where
$u_{f,g_{i,t}}$ is the velocity of particles in the f grain size fraction moving out of cell i in time t due to gravity [m/s]
g is the gravitational acceleration [m/s$^2$]
$\rho_s$ is the mass density of the particles [tonnes/m$^3$]
$\rho_w$ is the mass density of water [tonnes/m$^3$]
$d_f$ is the average diameter of particles in the f grain size fraction (either coarse or fine)[m]
$\mu$ is the viscosity of water [kg/(m s)]

Coarse particles are typically defined to have a diameter greater than 44 microns. Fine particles are defined to have a diameter less than or equal to 44 microns.

$$u_{ek_{i,t}} = a \times \varepsilon_w \times \varepsilon_0 \times \zeta_{i,t}/\mu \times \Delta V_{i,t}/l_{i,t} \qquad \text{Equation 3—}$$
Electrophoretic Particle Settlement Where $u_{ek_{i,t}}$ is the velocity of fines moving out of cell i in time t due to the force of electrophoresisek [m/s]

a is constant that is unique to the material being dewatered and that is derived empirically [dimensionless]

$\varepsilon_w$ is the relative permittivity of water [dimensionless]

$\varepsilon_0$ is the permittivity of free space (i.e. $8.854 \times 10^{-12}$) [F/m]

$\zeta_{i,t}$ is the zeta potential of cell i in time t [V]

$\Delta V_{i,t}$ is the voltage drop across cell i in time t [V]

$l_{i,t}$ is the average flowpath length for cell i in time t [m]

t is the length of the timestep[s]

These equations only apply when the tailings are in a slurry form. During the transition from a slurry to a solid soil, the proportion of the particles that are mobile decreases. After a point (i.e. around 55% wt/wt), none of the particles are mobile and particle settlement stops.

The electro-osmotic process involves the net movement of water toward the cathodes. At the same time, water is being driven towards the surface by gravity (i.e. the upward pressure created by the weight of the overlying solids) (FIG. 4). The electro-osmotic and hydraulic pressures are additive and the net movement of water is the combined result of both forces.

The upward movement of water due to gravity is forecast using D'Arcy's law (Equation #4)

Gravity Water Flow $$q_{h_{i,t}} = \left( \frac{(u_{i,t} - u_{i+1,t}) \times k_{h_{i,t}} \times A_i}{\rho_w \times g \times l_{i,t}} \right) \times t \qquad \text{Equation 4}$$

Where $q_{h_{i,t}}$ is the quantity of water moving out of cell i through cross-sectional area A [m] in time t due to hydraulic pressure [m²]

$u_{i,t}$ is the pore pressure of cell i in time t [kPa]

$k_{h_{i,t}}$ is the hydraulic conductivity of cell i in time t [m/s]

$\rho_w$ is the density of water [tonnes/m³]

g is the acceleration due to gravity [m/s²]

$A_i$ is the cross-sectional area of cell i [m]$^a$ $^a$The simulator is two dimensional. The total flow volume is calculated by multiplying times the surface area of the tailings deposit being dewatered.

The local hydraulic conductivity and the local hydraulic pressure for each cell change over the course of the dewatering process and are updated from one timestep to the next. The hydraulic pressure decreases as the effective stress builds and a portion of the weight of the overlying solids is borne by the soil matrix (FIG. 5). Once full consolidation is achieved all water flow is due solely to electro-osmosis.

The upward movement of water due to electro-osmosis is forecast using Casagrande's equation for electro-osmotic flow (Equation #5)

$$q_{o_{i,t}} = b \times (\varepsilon_w \times \varepsilon_0 \times \zeta_{i,t} \times n_{i,t}/\mu \times (\Delta V_{i,t} \times A_i)/l_{i,t}) \times t \qquad \text{Equation 5—Electro-osmotic Water Flow}$$

Where $q_{o_{i,t}}$ is the quantity of water moving out of cell i through cross-sectional area A along length l in time t [m]

b is constant that is unique to the material being dewatered and that is derived empirically [dimensionless]

$n_{i,t}$ is the average porosity of cell i in time t [dimensionless]

The electro-osmotic flow continues until the downward negative pore pressure gradient opposing the electro-osmotic flow is equal to the positive upward gradient created by the local electric field. During electro-osmotic flow, the porosity decreases resulting in the flow rate gradually declining. As well, as the pore pressure gradient declines, the flow rate declines.

The forecast final state of the cells is compared to the target % solids and other switching criteria relevant to the alternative applied power specification. If the final solids target has not been reached, the electrokinetic dewatering process simulator 148 runs another iteration. If the target has been met, the electrokinetic dewatering process simulator 148 stops. The key performance data for the alternative applied power specification are reported to the multiple criteria decision analysis processor 150.

Preferably, the adaptive electrokinetic dewatering control system 10 may specify the settings for each of the following applied power parameters. These applied power parameters apply to each electrode array 24. The applied power parameters are set to produce the optimum applied power specification to best achieve the switching criteria for the dewatering installation, for example:

1. magnitude of applied voltage;
2. frequency and duration of current intermittence;
3. frequency, magnitude and duration of polarity reversals; and
4. synchronisation of the power pulses among multiple electrode arrays 24.

The applied power specification that provides optimal electrokinetic dewatering is unique to each tailings deposit 20. Moreover, the applied power specification that provides optimal results changes as the electrokinetic dewatering process progresses. Provided below are some generic adjustments that may be made by the adaptive electrokinetic dewatering system 10 over the course of the electrokinetic dewatering process. The timing and extent of these adjustments may vary significantly from one situation to another. For this reason, an electrokinetic dewatering process simulator 148 is preferred to adjust the applied power specification when necessary.

As can now be understood, these adjustments are based on the observed dewatering performance and the simulated dewatering performance of the tailings deposit 20 being dewatered. By way of example, the following adjustments may be made:

1. Changes to the applied voltage—In general, the applied voltage is increased over the course of the dewatering process. Doing so causes the dewatering rate to increase.
2. Current intermittence—The length of the on-off cycle is adjusted over the course of the dewatering process. The length of the electrical current pulses regulates the local electrochemical conditions and the dewatering rate. Regulating the current intermittence among sets of electrodes allows the dewatering rate to be balanced over a large installation and improves the density gradients that are formed during the dewatering process.
3. Polarity reversal—Polarity reversal is used to enhance the electrochemical environment around the electrodes and to control the density gradients in the tailings deposit being dewatered. The current intermittence pattern and the frequency and duration of polarity reversal events are balanced to satisfy the switching criteria.
4. Synchronisation of power pulses—Synchronising current intermittence among sets of electrodes can reduce significantly the required capacity of the power supply system; a potentially major capital cost savings. The control system uses current intermittence to balance the total instantaneous applied power with the capacity of the power supply system. Balancing the power demand becomes increasingly important in the later stages of the dewatering process when the required applied voltage is being progressively increased.

While reference has been made to various preferred embodiments of the invention, other variations, implementations, modifications, alterations and embodiments are comprehended by the broad scope of the appended claims. Some of these have been discussed in detail in this specification and others will be apparent to those skilled in the art.

For example, the arrangement of components does not need to be as shown in the figures so long as data can be detected from the sensors 22 and power is capable of being distributed to the electrode arrays 24. In this regard, the central processor 12, power supply regulator 14, central power supply 15 and data acquisition and storage system 16 describe processors that allow the adaptive electrokinetic dewatering system 10 to complete the tasks for those components that are described herein to provide by way of example, an understanding of the present invention.

For example, each of the processor components of the control system 28 may be formed within the same physical unit or as separate units. Each processor component may operate as part of a virtual machine or may be part of a system that communicates remotely with components located in the tailings deposit 20. The connections between the components may be wireless or wired as long as control signals can be communicated between them. However, due to the number of parameters and the number and complexity of the calculations that are required to be performed in real time, the central processor 12 is an essential component of the control system 12 and the adaptive electrokinetic dewatering system 10 incorporating the same according to embodiments of the present invention. Excluding the central processor 12 would materially affect how the present invention works, if at all.

Furthermore, the various method steps described in the flowcharts shown in the figures are examples of preferred steps to be implemented by the adaptive electrokinetic dewatering system 10, which control the electrokinetic dewatering process for a tailings deposit 20. Various different simulators or other methods of calculating applied power specifications can be used so long as they adequately respond to the dynamic nature of the tailings deposit 20 and makes adjustments to each applied power specification, as needed, over the course of the electrokinetic dewatering process.

Those of ordinary skill in the art having access to the teachings herein will recognize these additional variations, implementations, modifications, alterations and embodiments, all of which are within the scope of the present invention, which invention is limited only by the appended claims.

The embodiments of the invention in which an exclusive property or privilege is claimed are defined as follows:

1. A control system for use in an electrokinetic dewatering system for dewatering a deposit said control system comprising:
   inputs and outputs;
   a programmed central processor;
   wherein said inputs include at least:
   sensor data from at least one sensor positioned in said deposit and adapted to measure present properties of said deposit; and
   an optimal applied power schedule including a series of applied power specifications with one or more switching criteria for each applied power specifications indicating when a new applied power specification should be applied; and
   wherein said programmed central processor is configured to:
   a) simulate an electrokinetic dewatering process applied to said deposit based on said sensor data;
   b) generate at least one alternative applied power specification, that when used in said simulation, satisfies said one or more of the switching criteria; and
   c) select the said at least one alternative applied power specification that best satisfies said one or more switching criteria; and
   wherein said outputs include an applied power specification and commands for controlling said electrokinetic dewatering system in accordance with said applied power specification.

2. The control system according to claim 1, wherein said alternative applied power specification is one of a series of applied power specifications that together comprise an applied power schedule for said dewatering process.

3. The control system according to claim 1, wherein said deposit comprises one or more of tailings, mature fine tailings (MFT), fluid fine tailings (FFT), sewage sludge, drilling mud, dredging spoils and soft clayey soils.

4. The control system according to claim 1, wherein said one or more switching criteria include a desired total amount of energy consumed, a desired maximum rate of energy consumption, a desired final dewatered state for said deposit, a desired total amount of consolidation of said deposit, a desired dewatering rate, a desired total elapsed time for the electrokinetic dewatering process and combinations thereof.

5. The control system according to claim 1, wherein said present properties of said deposit comprises at least one of a mudline or a soil surface elevation, a local electric field strength and a local pore pressure.

6. The control system according to claim 1, wherein said applied power specification comprises at least one power parameter that is a stepped increase in an applied voltage at a start-up of each power pulse including a number of steps, a voltage increment for each step and their duration, a peak voltage, a duration of the peak voltage, a duration of a "rest" period between pulses of power, a frequency of intermittent periods of reversed polarity for some or all electrodes, a duration of each polarity reversal, a duration of the "rest" periods between polarity reversals and resumption of normal polarity applied power pulses.

7. The control system according to claim 1, wherein said inputs further comprise a user interface configured to receive input from an operator and to provide said one or more switching criteria to said central processor in response to said input from said operator.

8. The control system according to claim 7, wherein said user interface is adapted to be operatively connected to a remote access device having an input device, an output device or a combination thereof.

9. The control system according to claim 7, wherein said user interface comprises an input device, an output device or a combination thereof.

10. The control system according to claim 1, wherein said central processor is further configured to receive said sensor data from said at least one sensor at regular intervals or continuously.

11. The control system according to claim 1, further comprises a data acquisition and storage system configured to receive and store said sensor data from said at least one sensor and make said received and stored sensor data accessible to said programmed central processor.

12. The control system according to claim 1, wherein said steps the programmed central processor are configured to perform include the additional steps of:
   d) generating said at least one alternative applied power specification;
   e) simulating said electrokinetic dewatering process using said at least one alternative applied power specification and said sensor data to generate a forecast dewatering performance of said at least one alternative applied power specification;
   f) evaluating said forecast dewatering performance of said at least one alternative applied power specification using said one or more switching criteria;
   g) selecting an optimal alternative applied power specification based on results of said evaluating step f) wherein at least one of said at least one alternative applied power specification satisfies said one or more switching criteria, otherwise repeating said steps d) to g).

13. The control system according to claim 12, wherein said step g) selects a first one of said at least one alternative applied power specifications to satisfy said one or more switching criteria as said optimal alternative applied power specification.

14. The control system according to claim 12, wherein said step d) generates a plurality of said alternative applied power specifications, said step e) generates a plurality of said forecast dewatering performances based on said plurality of said alternative applied power specifications, said step f) evaluates said plurality of said forecast dewatering performances using said one or more switching criteria, said step g) selects the best one of said plurality of said alternative applied power specifications that satisfies said one or more switching criteria as said optimal alternative applied power specification.

15. The control system according to claim 12, wherein said programmed central processor is further configured to assign a dewatering performance score to each of one of said plurality of said alternative applied power specifications generated in said step d), said steps d) to g) repeat until a difference between any two dewatering performance scores is less than a predetermined difference and said step g) selects the said alternative applied power specification having the best dewatering performance score.

16. The control system according to claim 12, wherein said plurality of said alternative applied power specifications generated at said step d) is limited to a predetermined minimum number or a predetermined maximum number.

17. The control system according to claim 12, wherein said forecast dewatering performance includes a forecast amount of energy consumed, a forecast rate of energy consumption, a forecast final dewatered state for said deposit, a forecast desired total amount of consolidation of said deposit, a forecast dewatering rate and combinations thereof.

18. The control system according to claim 12, wherein said programmed central processor is further configured to monitor said sensor data, generate a real dewatering performance of said electrokinetic dewatering process using said sensor data and to compare said real dewatering performance to said forecast dewatering performance; and
   wherein said real dewatering performance departs from said forecast dewatering performance by a predetermined amount, said programmed central processor initiates said steps d) to g).

19. The control system according to claim 18, wherein said real dewatering performance includes a real total elapsed time since the start of said electrokinetic dewatering process, a real amount of energy consumed by said electrokinetic dewatering process since said start, a real rate of energy consumed by said electrokinetic dewatering process at a time of said real dewatering, a real dewatered state of said deposit at said time, a real amount of consolidation of said deposit at said time, a real dewatering rate of said electrokinetic dewatering process at said time and combinations thereof.

20. The said central processor as part of said control system according to claim 1 is further configured such that when said control system is incorporated in said electrokinetic dewatering system, said commands control a flow of electrical power to said deposit.

21. The control system according to claim 1, further comprises a table of possible power parameters, each associated with a predetermined range of values, wherein said central processor is configured to generate said at least one alternative applied power specification by selecting one or more of said possible power parameters and assigning to each said selected one or more possible power parameters a random value falling within said predetermined range of values.

22. An adaptive electrokinetic dewatering system for dewatering a deposit, said system comprising:
   the control system as claimed in claim 1;
   a source of electrical power;
   at least one power distribution substation operably connected to said source of electrical power;
   at least one electrode array operably connected to said at least one said power distribution substation, said at least one electrode array being positioned in said deposit and adapted to apply electric power to said deposit; and
   said at least one sensor being operably connected to said control system;
   wherein said commands control said source of electrical power and said at least one power distribution substation to apply electrical power to said deposit via said at least one electrode array in accordance with said applied power specification.

23. The adaptive electrokinetic dewatering system according to claim 22, wherein said at least one sensor comprises a local electric field strength sensor, a mudline height or soil surface elevation sensor or a pore water sensor.

24. A method of adaptively dewatering a deposit using an electrokinetic dewatering process, said method comprising the steps of:
   a) determining one or more dewatering performance criteria;
   b) measuring present properties of said deposit being dewatered;
   c) evaluating the current applied power specification relative to these performance criteria and making a determination if the applied power specification is appropriate;
   d) generating at least one alternative applied power specification;
   e) simulating said electrokinetic dewatering process applied to said deposit based on said present properties of said deposit and said at least one alternative applied power specification and generating a forecast dewatering performance based on said simulation;

f) determining whether said forecast dewatering performance of said at least one alternative applied power specification satisfies said one or more dewatering performance criteria;

g) if so, selecting an optimal one of said at least one alternative applied power setting that has the best forecast dewatering performance for use in said electrokinetic dewatering process, otherwise repeating said steps b) to f); and h) providing an applied power specification based on said optimal alternative applied power specification and controlling said electrokinetic dewatering process in accordance with said applied power specification.

25. The method according to claim 24, wherein said deposit comprises mine tailings, mature fine tailings (MFT), fluid fine tailings (FFT), sewage sludge, drilling mud, dredging spoils or soft clayey soils.

26. The method according to claim 24, wherein said one or more dewatering performance criteria include a desired total amount of energy consumed, a desired maximum rate of energy consumption, a desired final dewatered state for said deposit, a desired total amount of consolidation of said deposit and combinations thereof.

27. The method according to claim 24, wherein said present properties of said deposit comprises at least one of a mudline, a local electric field strength and a local pore pressure.

28. The method according to claim 24, wherein said forecast dewatering performance includes a forecasted amount of energy consumed, a forecasted rate of energy consumption, a forecasted final dewatered state for said deposit, a forecasted desired total amount of consolidation of said deposit, a forecasted dewatering rate and combinations thereof.

29. The method according to claim 24, wherein said electrokinetic dewatering process comprises applying an electric current to said deposit via a plurality of electrodes placed in said deposit.

30. The method according to claim 24, wherein said one or more dewatering performance criteria include a desired total amount of energy consumed, a desired maximum rate of energy consumption, a desired final dewatered state for said deposit, a desired total amount of consolidation of said deposit, a desired dewatering rate, a desired total elapsed time since the start of the electrokinetic dewatering process and combinations thereof.

31. The method according to claim 24, further comprises the step of providing a table of possible power parameters, each associated with a predetermined range of values, wherein said step c) comprises generating said at least one alternative applied power specification by selecting one or more of said possible power parameters and assigning to each said selected one or more possible power parameters a random value falling within said predetermined range of values.

32. The method according to claim 24, wherein said possible power parameter is a stepped increase in an applied voltage at a start-up of each power pulse including a number of steps, a voltage increment for each step and their duration, a peak voltage, a duration of the peak voltage, a duration of a "rest" period between pulses of power, a frequency of intermittent periods of reversed polarity for some or all electrodes, a duration of each polarity reversal, a duration of the "rest" periods between polarity reversals and resumption of normal polarity applied power pulses.

33. The method according to claim 24 further comprises monitoring said present properties, generating a real dewatering performance of said electrokinetic dewatering process using said sensor data and to compare said real dewatering performance to said forecast dewatering performance; and when said real dewatering performance departs from said forecast dewatering performance by a predetermined amount, repeating said steps b) to g).

34. The method according to claim 33, wherein said real dewatering performance includes a real total elapsed time since the start of said electrokinetic dewatering process, a real amount of energy consumed by said electrokinetic dewatering process since said start, a real rate of energy consumed by said electrokinetic dewatering process at a time of said generating said real dewatering performance, a real dewatered state of said deposit at said time, a real amount of consolidation of said deposit at said time, a real dewatering rate of said electrokinetic dewatering process at said time and combinations thereof.

35. The method according to claim 24, wherein said step f) selects a first one of said at least one alternative applied power specifications having said forecast dewatering performance satisfying said one or more desired dewatering performance criteria as said optimal alternative applied power specification.

36. The method according to claim 24, wherein said step c) generates a plurality of said alternative applied power specifications, said step d) generates a plurality of said forecast dewatering performances based on said plurality of said alternative applied power specifications, said step e) evaluates said plurality of said forecast dewatering performances using said one or more dewatering performance criteria, said step f) selects the best one of said plurality of said alternative applied power specifications that satisfies said one or more dewatering performance criteria as said optimal alternative applied power specification.

37. The method according to claim 36, wherein said programmed central processor is further configured to assign a dewatering performance score to each of one of said plurality of said alternative applied power specifications generated in said step c), said steps c) to e) repeat until a difference between any two dewatering performance scores is less than a predetermined difference and said step f) selects said optimal alternative applied power specification having the best dewatering performance score.

38. The method according to claim 36, wherein said plurality of said alternative applied power specifications generated at said step c) is limited to a predetermined minimum number or a predetermined maximum number.

* * * * *